United States Patent
Szu

(10) Patent No.: US 6,186,817 B1
(45) Date of Patent: Feb. 13, 2001

(54) FINE PITCH CONTACT FOR A ZIF SOCKET

(75) Inventor: Ming-Lun Szu, Taipei (TW)

(73) Assignee: Hon Hai Precision Ind. Co., Ltd., Taipei Hsien (TW)

(*) Notice: Under 35 U.S.C. 154(b), the term of this patent shall be extended for 0 days.

(21) Appl. No.: 09/429,764

(22) Filed: Oct. 28, 1999

(30) Foreign Application Priority Data

Mar. 30, 1999 (TW) .............................................. 88204823

(51) Int. Cl.[7] .................................................. H01R 13/625
(52) U.S. Cl. .............................................................. 439/342
(58) Field of Search .................................... 436/342, 862, 436/869

(56) References Cited

U.S. PATENT DOCUMENTS 4,498,725 * 2/1985 Bright et al. .

5,989,049 * 11/1999 Walkup et al. ....................... 439/342

* cited by examiner

Primary Examiner—Khiem Nguyen
(74) Attorney, Agent, or Firm—Wei Te Chung

(57) ABSTRACT

A fine pitch contact for a ZIF socket in accordance with a first embodiment of the present invention comprises a base for being fixed in the socket, a tail for being connected to a PCB, and a curved twisted body upwardly extending from the base. The body is twisted about a central line thereof and acts as both a lead-in portion and an engaging portion to reduce the size thereof thereby promoting an increase in the density of the contacts of the ZIF socket. In accordance with a second embodiment of the present invention, a fine pitch contact for a ZIF socket comprises a base, a tail and a body. The body comprises a first bent portion formed proximate a free end thereof and a second bent portion formed by bending out of the plane of the body along an oblique bend line. The first and the second bent portions respectively perform a lead-in function and an engaging function to reduce the size of the body.

6 Claims, 8 Drawing Sheets

FINE PITCH CONTACT FOR A ZIF SOCKET

BACKGROUND OF THE INVENTION

1. Field of the Invention

The present invention relates to a contact, and especially to a fine pitch contact for use with a zero insertion force (ZIF) socket.

2. Description of Prior Art

As computer functions continue to expand, an IC package, such as a Central Processing Unit (CPU), requires an increasing number of memory processing units, thus pins of the IC package are arranged to be more compact. Correspondingly, a socket for coupling with the IC package has more contacts. A conventional contact used in a ZIF socket related to the present invention is disclosed in U.S. Pat. No. 4,988,310 and in Taiwan Patent Application Nos. 83203222, 83208396, 83212081 and 83212046.

Referring to FIGS. 1A and 1B, a conventional contact 1 used in a ZIF socket 7 comprises a base 12 for being fixed in the socket 7, a tail 13 downwardly extending from the base 12 for electrically connecting with a printed circuit board (not shown), a mating portion 14 formed at a free end thereof, and a beam 15 interconnecting the base 12 and the mating portion 14. The mating portion 14 is a cantilevered beam and includes an engaging section 144 and a lead-in section 142 outwardly extending from the engaging section 144 distanced from the beam 15. The engaging section 144 is adapted for engaging with a CPU pin 2 to implement an electrical connection therebetween. When the CPU pin 2 is moved in a direction as indicated by the arrow "A" to contact the engaging section 144, the lead-in section 142 deforms to exert a normal force on the pin 2 and guides the CPU pin 2 to connect with the engaging section 144.

The mating portion 14 of the conventional contact 1 has a significant length $L_1$ due to the provision of the outwardly extending lead-in section 142. The mating portion 14 usually extends within and therefore occupies a certain portion of a corresponding passageway 8 defined in the socket 7. Due to the trend of miniaturization, the passageways 8 of the socket 7 are required to have smaller dimension. However, the mating portion 14 of the conventional contact 1 remains to occupy a significant portion of the corresponding passageway 8 of the socket 7, which prevents the length $D_1$ of the passageway 8 from being reduced. Thus, the conventional contact 1 cannot satisfy requirements of an IC package having more compact pins.

SUMMARY OF THE INVENTION

Accordingly, an object of the present invention is to provide a fine pitch contact used in a ZIF socket having a body acting as both a lead-in portion and an engaging portion for promoting an increase in the density of the contacts of the ZIF socket.

According to a first embodiment of the present invention, a fine pitch contact for a ZIF socket comprises a base for being fixed in the socket, a curved twisted body upwardly extending from the base and a tail downwardly extending from the base for being connected to a PCB (printed circuit board). The body is twisted about a central line thereof for acting as both a lead-in portion and an engaging portion to reduce the size of the contact thereby promoting an increase in the density of the contacts of the ZIF socket.

According to a second embodiment of the present invention, a fine pitch contact for a ZIF socket comprises a base for being fixed in the socket, a body extending from the base and a tail for being connected to a PCB. The body includes a first bent portion formed proximate a free end thereof and a second bent portion bent in a reverse direction relative to the-first bent portion. The first and the second bent portions respectively act as a lead-in portion and an engaging portion to reduce the size of the contact thereby promoting an increase in the density of the contacts of the ZIF socket.

BRIEF DESCRIPTION OF THE DRAWINGS

Other objects and advantages of the present invention will be understood from the following descriptions of a fine pitch contact for a ZIF socket according to embodiments of the present invention shown in the accompanying drawings, in which.

DETAILED DESCRIPTION OF THE EMBODIMENTS

Figure 1A:
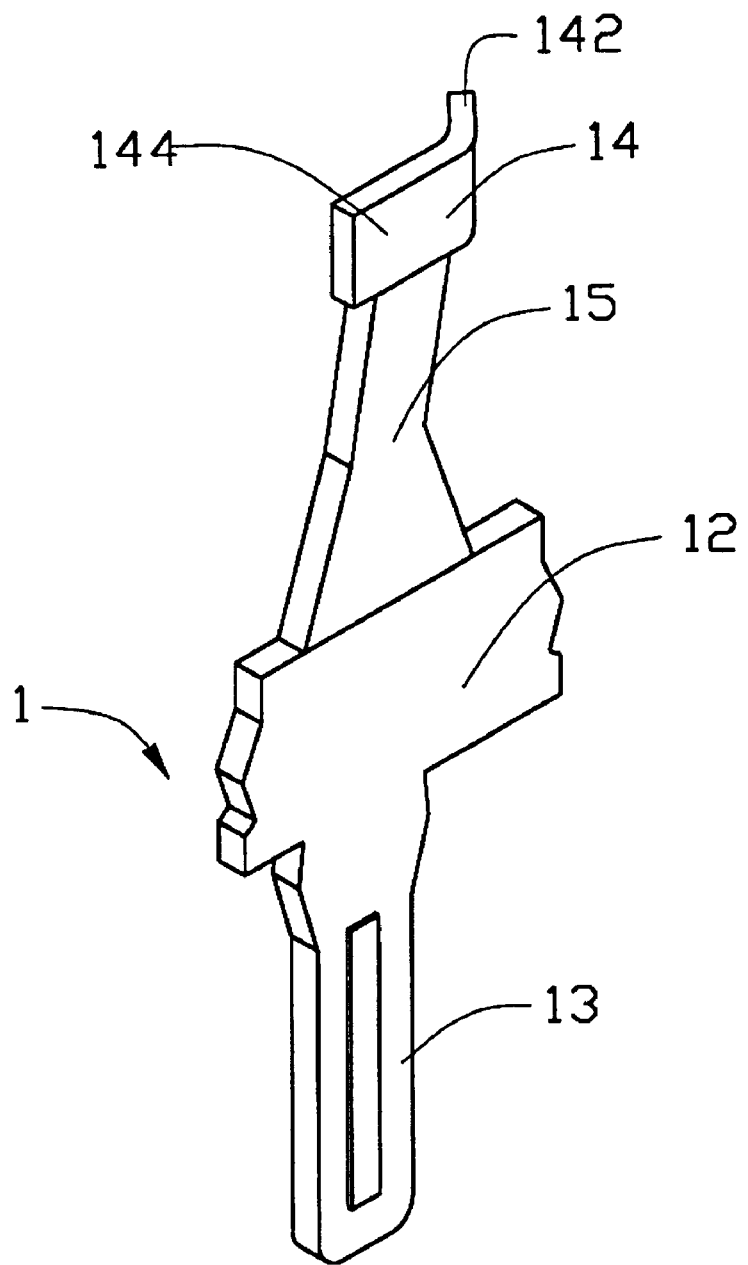
FIG. 1A is a perspective view of a conventional contact used in a ZIF socket.
Figure 1B:
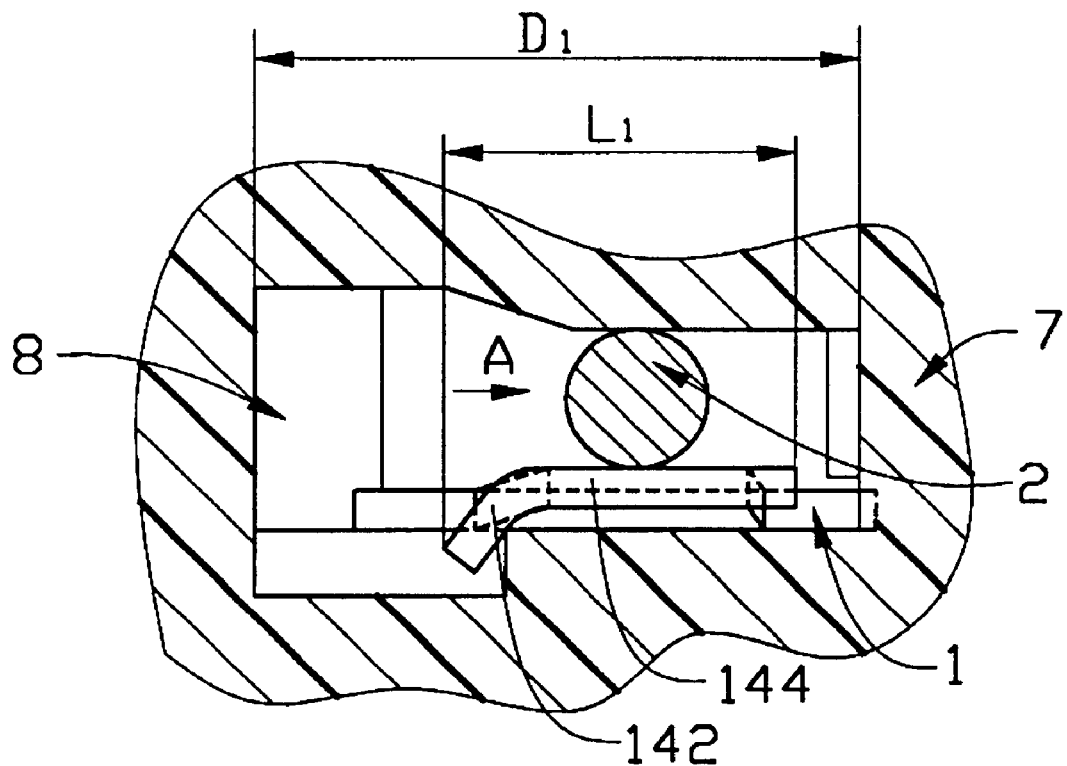
FIG. 1B is a partial cross-sectional view showing a conventional contact of FIG. 1A received in a corresponding passageway of a ZIF socket.

For facilitating understanding, like components are designated by like reference numerals throughout the various embodiments as shown in the attached drawing figures.

Figure 2A:
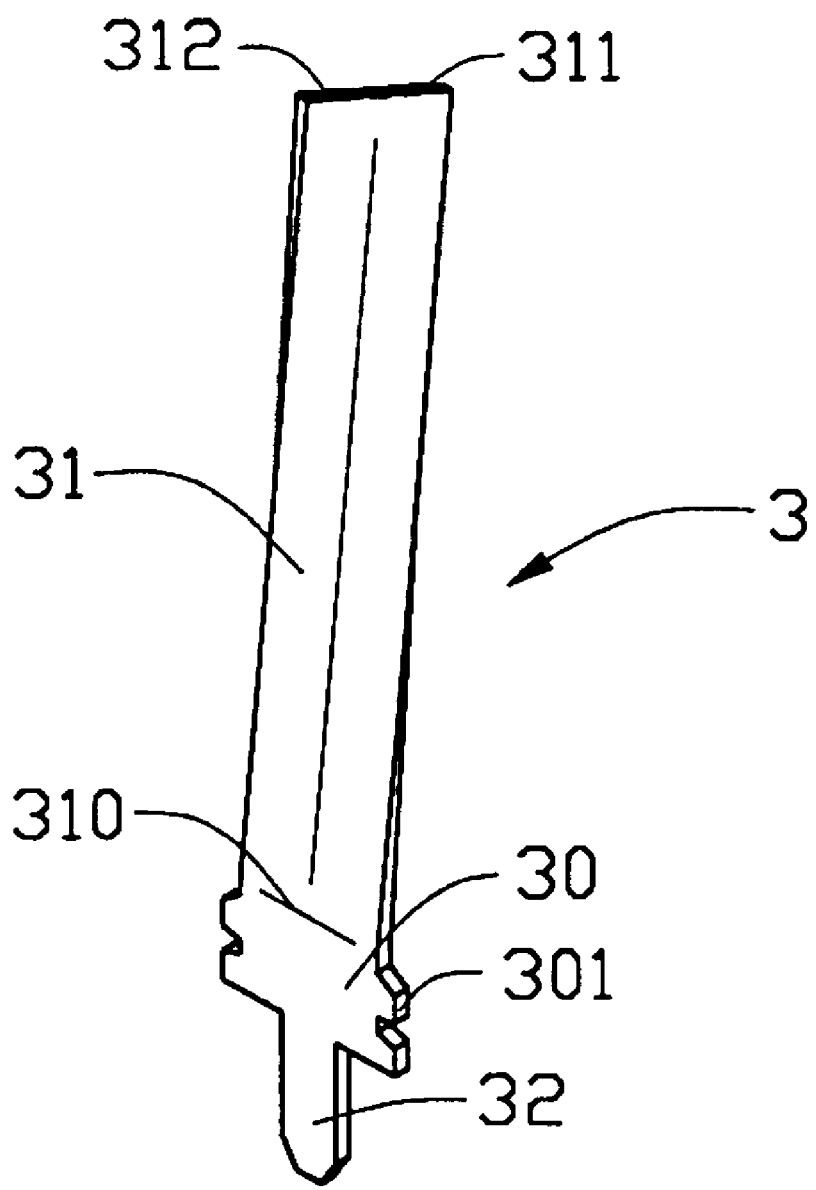
FIG. 2A is a perspective view of a contact used in a ZIF socket in accordance with a first embodiment of the present invention.
Figure 2B:
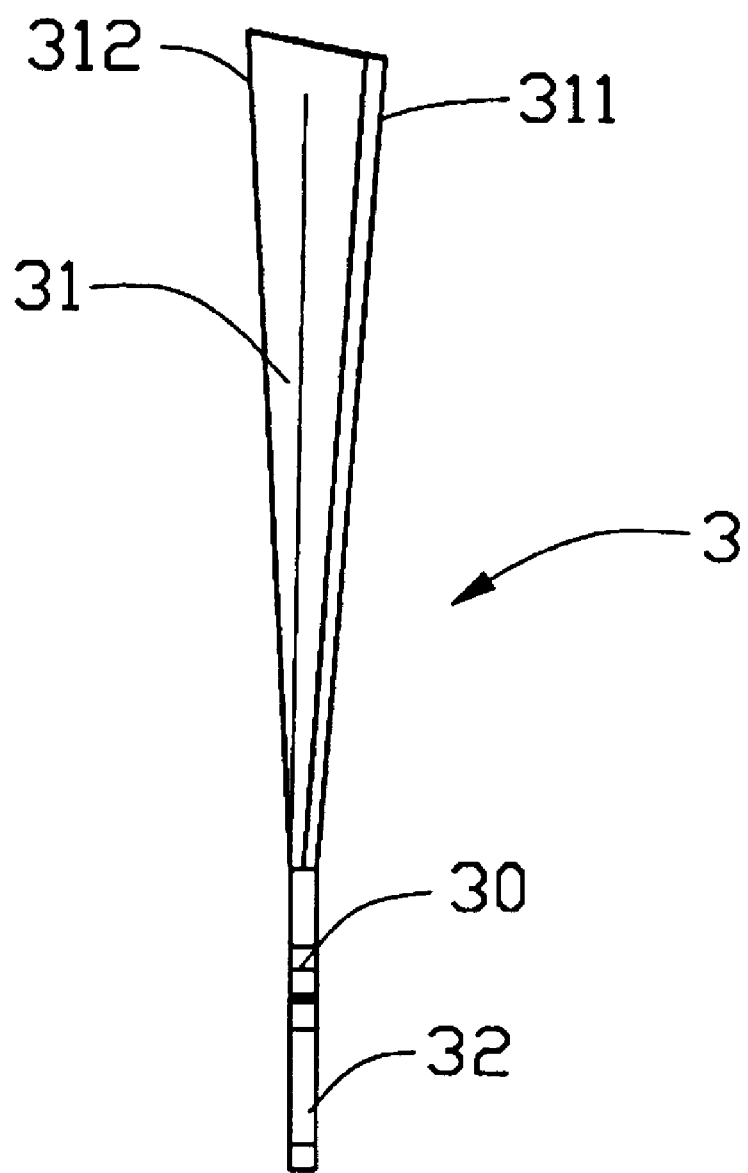
FIG. 2B is a perspective view of a contact of FIG. 2A taken from a different angle.
Figure 2C:
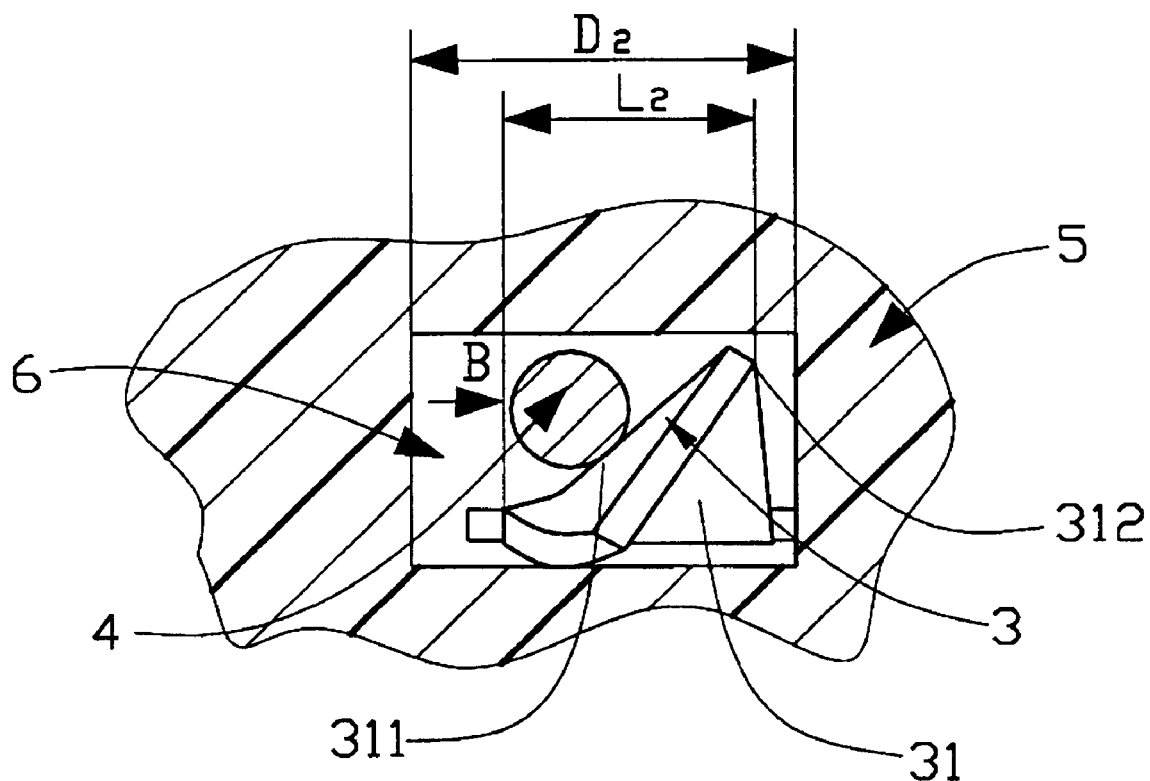
FIG. 2C is a partial cross-sectional view showing a contact of FIG. 2A received in a corresponding passageway of a ZIF socket.

Referring to FIGS. 2A–2C, a fine pitch contact 3 used in a ZIF socket 5 in accordance with a first embodiment of the present invention comprises a base 30, a curved twisted body 31 upwardly extending from the base 30, and a tail 32 downwardly extending from the base 30 for connecting with a PCB (not shown). The base 30 has a pair of barbs 301 formed on each edge thereof for interferentially engaging with the socket 5 thereby securely fixing the contact 3 therein.

The body 31 is twisted about a central line thereof. To provide additional resiliency, the body 31 can be bent out of the plane of the base 30 along a bend line 310 to form a cantilever beam. The body 31 includes a lead-in portion 311 and an engaging portion 312 forming an obtuse angle with the lead-in portion 311. If the body 31 is divided into right and left halves, the right half acts as the lead-in section 142 of the conventional contact 1 (FIG. 1A), and the left half acts as the engaging section 144 of the conventional contact 1. When a CPU pin 4 is moved in a direction as indicated by the arrow "B" to contact the engaging portion 312, the lead-in portion 311 deforms to exert a normal force on the CPU pin 4 and guides the pin 4 to connect with the engaging portion 312. To further facilitate engagement between the CPU pin 4 and the engaging portion 312, an additional lead-in section (not shown) can be provided to outwardly extend from the lead-in portion 311.

Since the body 31 performs both a lead-in function as implemented by the lead-in portion 311 and an engaging function as implemented by the engaging portion 312, the length $L_2$ of the body 31 is significantly reduced. Correspondingly, the length $D_2$ of a corresponding passageway 6 of the socket 5 can be significantly reduced thereby promoting an increase in the density of the contacts 3 of the ZIF socket 5.

Figure 3A:
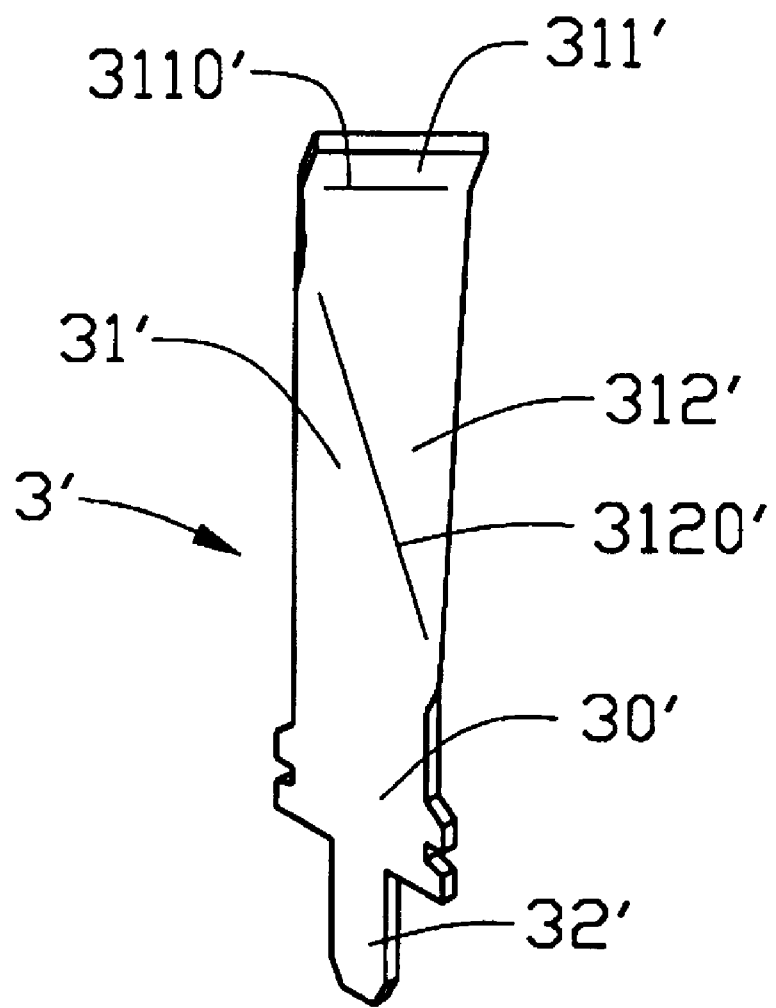
FIG. 3A is a perspective view of a contact in accordance with a second embodiment of the present invention.
Figure 3B:
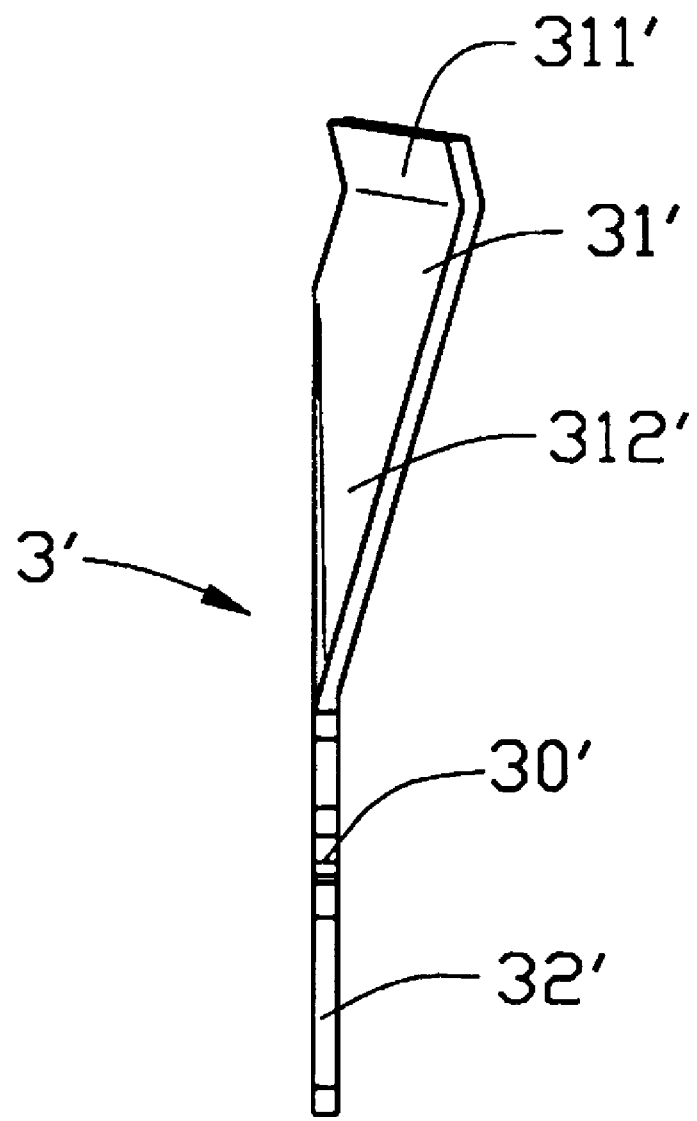
FIG. 3B is a perspective view of a contact of FIG. 3A taken from a different angle.
Figure 3C:
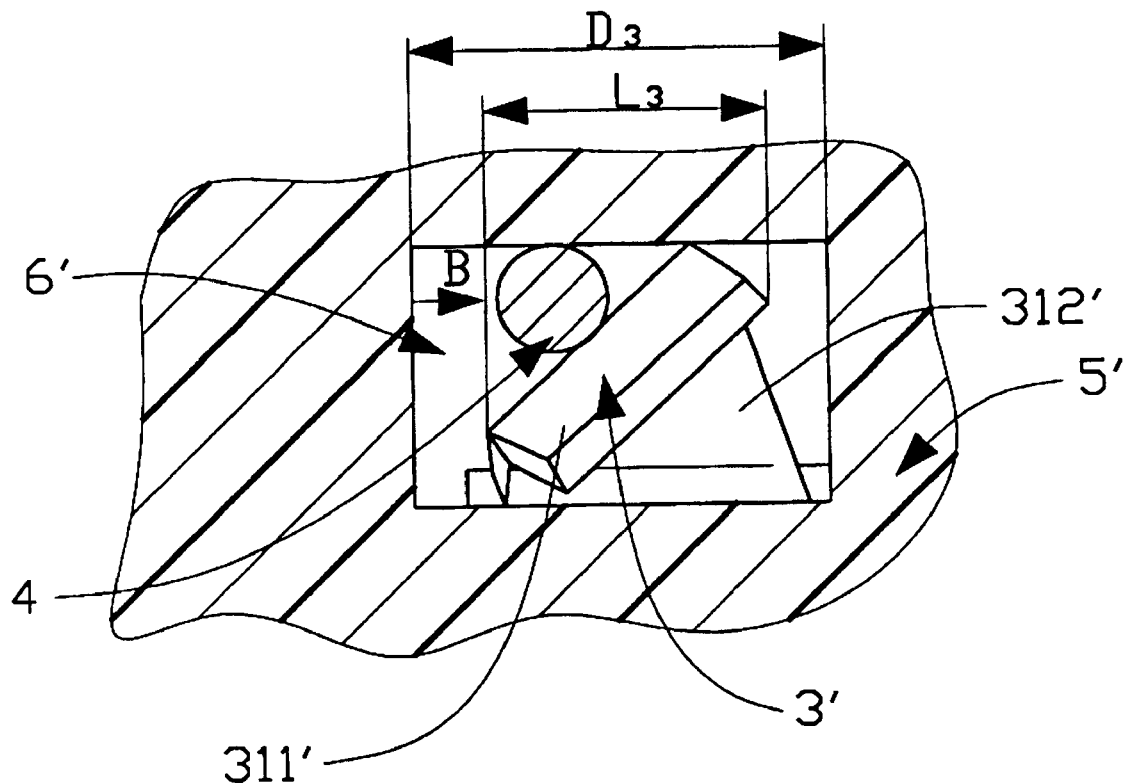
FIG. 3C is a partial cross-sectional view showing a contact of FIG. 3A received in a corresponding passageway of a ZIF socket.

Referring to FIGS. 3A–3C, a contact 3' used in a ZIF socket 5' in accordance with a second embodiment of the present invention includes a base 30', a body 31' upwardly extending from the base 30', and a tail 32' downwardly extending from the base 30'. The body 31' has first and second bent portions 311' and 312'. The first bent portion 311' is formed proximate a free end of the body 31' for acting as the lead-in section 142 of the conventional contact 1 (FIG. 1A). The first bent portion 311' upwardly and outwardly extends from a first bend line 3110' along which the first bent portion 311' is bent out of the plane of the second bent portion 312'. The first bend line 3110' is oblique relative to the transverse direction of the body 31'. The second bent portion 312' is formed by inwardly bending out of the plane of the body 31' along an oblique second bend line 3120' relative to the longitudinal direction of the body 31' for acting as the engaging section 144 of the conventional contact 1 (FIG. 1A). When a CPU pin 4 is moved in a direction as indicated by the arrow "B" to contact the second bent portion 312', the first bent portion 311' deforms to exert a normal force on the CPU pin 4 and guides the pin 4 to connect with the second bent portion 312'. To further facilitate engagement between the CPU pin 4 and the second bent portion 312', an additional lead-in section (not shown) can be provided to outwardly extend from the first bent portion 311'.

Since the first and the second bent portions 311' and 312' of the body 31' respectively performs a lead-in function and an engaging function, the length $L_3$ of the body 31' is significantly reduced. Correspondingly, the length $D_3$ of a corresponding passageway 6' of the socket 5' can be significantly reduced thereby promoting an increase in the density of the contacts 3' of the ZIF socket 5'.

It will be understood that the present invention may be embodied in other specific forms without departing from the spirit of the central characteristics thereof. The present example and embodiments, therefore, are to be considered in all respects as illustrative and not restrictive, and the invention is not to be limited to the details given herein.

What is claimed is:

1. A contact used in a socket for electrically connecting with a pin of an IC package, the contact comprising:
   a base for being fixed in the socket;
   a tail downwardly extending from the base for being connected to a printed circuit board; and
   a twisted body upwardly extending from the base and forming a lead-in portion and an engaging portion, said lead-in portion guiding a pin of an IC package into engagement with the engaging portion.

2. The contact as described in claim 1, wherein the body is twisted about a central line thereof.

3. A contact used in a socket for electrically connecting with a pin of an IC package, the contact comprising:
   a base for being fixed in the socket;
   a tail downwardly extending from the base for being connected to a printed circuit board; and
   a body upwardly extending from the base, said body including a first bent portion and a second bent portion, said first bent portion being formed proximate a free end of the body and being bent out of the plane of the second bent portion along a first bend line in a first direction for guiding a pin of an IC package into engagement with the second bent portion, said second bent portion being bent out of the plane of the body along a second bend line in a reverse direction relative to the first direction for engaging with the pin of the IC package.

4. The contact as described in claim 3, wherein the first bend line is oblique relative to a transverse direction of the body.

5. The contact as described in claim 3, wherein the second bend line is oblique relative to a longitudinal direction of the body.

6. A socket assembly for electrically connecting with a pin of an IC package which is adapted to be relatively moved in a sliding direction, comprising:
   a socket body defining at least a passageway therein;
   a contact received within said passageway, said contact including a plate-like base defining a dimension along said sliding direction, said dimension being slightly smaller than a lengthwise dimension of the corresponding passageway along said sliding direction; and
   a twisted body upwardly extending from the base with twisting along almost a full length thereof; wherein
   said twisted body defining a width being slightly smaller than said dimension of the base while large enough to confront two side walls of the passageway in a transverse direction perpendicular to said sliding direction.

* * * * *